United States Patent
Han et al.

(10) Patent No.: US 9,269,564 B2
(45) Date of Patent: Feb. 23, 2016

(54) THIN FILM DEPOSITION APPARATUS

(71) Applicant: SAMSUNG ELECTRONICS CO., LTD., Gyeonggi-do (KR)

(72) Inventors: Kyung-Don Han, Gyeonggi-do (KR); Jeen-Seok Cho, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 620 days.

(21) Appl. No.: 13/682,520

(22) Filed: Nov. 20, 2012

(65) Prior Publication Data

US 2013/0206066 A1    Aug. 15, 2013

(30) Foreign Application Priority Data

Jan. 26, 2012    (KR) .................. 10-2012-0007795

(51) Int. Cl.
| H01L 21/02 | (2006.01) |
| C23C 16/44 | (2006.01) |
| C23C 16/455 | (2006.01) |
| C23C 16/458 | (2006.01) |

(52) U.S. Cl.
CPC ...... *H01L 21/02104* (2013.01); *C23C 16/4401* (2013.01); *C23C 16/4404* (2013.01); *C23C 16/4412* (2013.01); *C23C 16/455* (2013.01); *C23C 16/4582* (2013.01); *C23C 16/45508* (2013.01); *C23C 16/45563* (2013.01); *C23C 16/45587* (2013.01); *C23C 16/45591* (2013.01)

(58) Field of Classification Search
CPC ............ C23C 16/4412; C23C 16/4404; C23C 16/455; C23C 16/45587; C23C 16/45591; C23C 16/4582
USPC ...................... 118/715; 156/345.1
See application file for complete search history.

(56) References Cited

U.S. PATENT DOCUMENTS

| 5,641,375 | A | * | 6/1997 | Nitescu | H01J 37/32495 156/345.1 |
| 5,891,350 | A | * | 4/1999 | Shan | H01J 37/32477 118/723 E |
| 6,036,782 | A | * | 3/2000 | Tanaka | C23C 16/455 118/715 |
| 6,261,408 | B1 | * | 7/2001 | Schneider | C23C 16/4412 118/715 |
| 6,531,069 | B1 | * | 3/2003 | Srivastava | H01J 37/32623 118/723 R |
| 8,152,925 | B2 | * | 4/2012 | Iizuka | H01J 37/3244 118/715 |
| 8,771,417 | B2 | * | 7/2014 | Yoon | H01J 37/32357 118/715 |

(Continued)

FOREIGN PATENT DOCUMENTS

| JP | 10-209049 A | 8/1998 |
| JP | 2007-067213 A | 3/2007 |

(Continued)

*Primary Examiner* — Rudy Zervigon
(74) *Attorney, Agent, or Firm* — McDermott Will & Emery LLP

(57) ABSTRACT

A thin film deposition apparatus includes a reaction chamber, a main disk installed in the reaction chamber, and a gas discharging unit disposed outside the main disk. The gas discharging unit recollects a gas in the reaction chamber, and includes: a base member that includes an outer sidewall, an inner sidewall, and a lower wall that connects the outer and inner sidewalls, and is ring-shaped with an open upper portion. At least one through hole is formed in the lower wall. A discharge sleeve is configured to be inserted into the through hole, wherein a gas outlet is formed in the discharge sleeve. An upper cover that is ring-shaped covers the open upper portion of the base member. A plurality of gas inlets are formed in the upper cover.

10 Claims, 13 Drawing Sheets

(56) References Cited

U.S. PATENT DOCUMENTS

| | | | | |
|---|---|---|---|---|
| 8,790,489 B2* | 7/2014 | Honda | | H01J 37/18 118/715 |
| 8,968,475 B2* | 3/2015 | Odagiri | | H01L 21/67017 118/715 |
| 9,153,421 B2* | 10/2015 | Booth | | H01J 37/32935 |
| 2002/0038791 A1* | 4/2002 | Okumura | | C23C 16/4412 216/71 |
| 2004/0187780 A1* | 9/2004 | Park | | H01L 21/6719 118/715 |
| 2005/0103267 A1* | 5/2005 | Hur | | H01J 37/3244 118/715 |
| 2005/0224180 A1* | 10/2005 | Bera | | C23C 16/4412 156/345.33 |
| 2006/0011299 A1* | 1/2006 | Condrashoff | | H01J 37/32834 156/345.47 |
| 2008/0035605 A1* | 2/2008 | Takahashi | | H01J 37/32844 216/58 |
| 2008/0072821 A1* | 3/2008 | Dalton | | C30B 35/00 118/715 |
| 2008/0149596 A1* | 6/2008 | Dhindsa | | H01J 37/3244 216/67 |
| 2009/0029046 A1* | 1/2009 | Kudoh | | H01L 21/67017 427/248.1 |
| 2009/0044751 A1* | 2/2009 | Park | | H01J 37/32495 118/723 E |
| 2009/0061648 A1 | 3/2009 | Horii et al. | | |
| 2010/0206231 A1* | 8/2010 | Yoon | | H01J 37/32357 118/723 I |
| 2011/0021034 A1* | 1/2011 | Yang | | C23C 16/45591 438/758 |
| 2012/0000886 A1* | 1/2012 | Honda | | H01J 37/18 216/24 |
| 2012/0145080 A1* | 6/2012 | Park | | C23C 16/4412 118/725 |
| 2012/0180726 A1* | 7/2012 | Han | | C23C 16/4584 118/728 |
| 2013/0206066 A1* | 8/2013 | Han | | H01L 21/02104 118/715 |
| 2014/0190405 A1* | 7/2014 | Chang | | C23C 16/4409 118/70 |
| 2014/0261182 A1* | 9/2014 | Nakazawa | | C23C 16/45589 118/723 R |
| 2015/0011095 A1* | 1/2015 | Chandrasekharan | | H01L 21/67017 438/758 |
| 2015/0027635 A1* | 1/2015 | Hanaoka | | H01J 37/32091 156/345.3 |
| 2015/0187545 A1* | 7/2015 | Lee | | H01J 37/32091 216/67 |

FOREIGN PATENT DOCUMENTS

| | | |
|---|---|---|
| JP | 2009-088185 A | 4/2009 |
| KR | 2004-0085315 A | 10/2004 |
| KR | 2009-0086375 A | 8/2009 |
| KR | 2009-0116236 A | 11/2009 |
| KR | 2010-0044517 A | 4/2010 |
| KR | 2010-0106130 A | 10/2010 |

* cited by examiner

THIN FILM DEPOSITION APPARATUS

CROSS-REFERENCE TO RELATED APPLICATION

This U.S. non-provisional patent application claims priority under 35 U.S.C. §119 to Korean Patent Application No. 10-2012-0007795, filed on Jan. 26, 2012, in the Korean Intellectual Property Office, the disclosure of which is incorporated herein in its entirety by reference.

TECHNICAL FIELD

The present disclosure relates to thin film deposition apparatuses, and more particularly, to thin film deposition apparatuses including a gas discharging unit.

BACKGROUND

A chemical vapor deposition (CVD) apparatus is used to form a thin film on a deposition target (e.g., a substrate such as a semiconductor wafer) via a chemical reaction. The CVD apparatus is usually configured to grow a thin film on a substrate using a reaction gas by injecting the reaction gas having a high vapor pressure in a vacuum chamber in which the substrate is arranged.

Recently, along with the development of high integration and high performance semiconductor devices, a CVD method, such as a metal organic CVD (MOCVD) method has become popular. In particular, when manufacturing a high efficiency/high output light emitting device (LED), a MOCVD apparatus is used.

SUMMARY

Provided are thin film deposition apparatuses that have good durability and allow easy maintenance of a gas discharging unit.

Additional aspects will be set forth in part in the description which follows and, in part, will be apparent from the description, or may be learned by practice of the presented examples.

An exemplary thin film deposition apparatus includes: a reaction chamber; a main disk installed in the reaction chamber; and a gas discharging unit that is disposed outside the main disk and recollects a gas in the reaction chamber. The gas discharging unit includes: a base member that includes an outer sidewall, an inner sidewall, and a lower wall that connects the outer and inner sidewalls, and is ring-shaped with an open upper portion, wherein at least one through hole is formed in the lower wall; a discharge sleeve configured to be inserted into the through hole, wherein a gas outlet is formed in the discharge sleeve; and an upper cover that is a ring-shaped member covering the open upper portion of the base member, wherein a plurality of gas inlets are formed in the upper cover.

The discharge sleeve includes an inserting portion configured to be inserted into the at least one through hole and a wing portion extending from the inserting portion.

The upper cover includes a plurality of upper cover fragments that are disposed in a circumferential direction. An insulating material may be interposed between the plurality of upper cover fragments. The plurality of upper cover fragments may be made of graphite, and a coating layer of a silicon carbide may be disposed on surfaces of the plurality of upper cover fragments.

The exemplary thin film deposition apparatus further includes: a diffusion barrier disposed below the main disk and configured to prevent diffusion of a gas to an area below the main disk; and a diffusion barrier cover that is disposed outside the main disk and configured to cover an upper surface of the diffusion barrier.

The diffusion barrier cover may be made of graphite. The diffusion barrier cover includes a plurality of diffusion barrier cover fragments that are disposed in a circumferential direction. An insulating material may be interposed between the diffusion barrier cover fragments. The plurality of upper cover fragments may be made of graphite, and a coating layer of a silicon carbide may be formed on surfaces of the plurality of upper cover fragments.

The diffusion barrier cover can also be integrally with the upper cover, and include a cover portion covering the open upper portion of the base member and including a gas inlet and a barrier portion that covers an upper surface of the diffusion barrier. The diffusion barrier cover that is integral with the upper cover may include a plurality of fragments disposed in a circumferential direction. An insulating material may be interposed between the plurality of fragments. The plurality of fragments may be made of graphite, and a coating layer of a silicon carbide may be formed on surfaces of the fragments.

The exemplary thin film deposition apparatus further includes: a housing including a lower housing in the form of a concave container with an open upper portion and a cover portion covering the open upper portion, wherein the housing surrounds the reaction chamber; a sidewall member that is disposed in the housing to form a sidewall of the reaction chamber, wherein the sidewall member is supported by an outer sidewall of the base member and extended upwardly; and an upper sealing member that is coupled to the cover portion and is adhered to the sidewall member to form an upper wall of the reaction chamber.

Another exemplary thin film deposition apparatus includes: a reaction chamber; a main disk installed in the reaction chamber; a diffusion barrier disposed below the main disk and configured to prevent diffusion of a gas to a portion below the main disk; and a diffusion barrier cover that is made of graphite and ring-shaped, and is disposed outside the main disk to cover an upper surface of the diffusion barrier.

The diffusion barrier cover may include a plurality of diffusion barrier fragments disposed in a circumferential direction. An insulating material may be interposed between the plurality of diffusion barrier cover fragments. A silicon carbide coating layer may be disposed on surfaces of the plurality of diffusion barrier cover fragments.

The exemplary thin film deposition apparatus further includes: a base member that includes an outer sidewall, an inner sidewall, and a lower wall that connects the outer and inner sidewalls, and is a ring-shaped member with an open upper portion, wherein at least one through hole is formed in the lower wall; and a discharge sleeve configured to be inserted into the through hole, wherein a gas outlet is formed in the discharge sleeve, wherein the diffusion barrier cover extends to a portion above the base member to cover the open upper portion so as to form a collection space, and a plurality of gas inlets connected to the collection space are formed in the diffusion barrier cover. The diffusion barrier cover may include a plurality of fragments disposed in a circumferential direction. An insulating material may be interposed between the plurality of fragments.

Another exemplary embodiment includes a gas discharging unit in a chemical vapor deposition apparatus comprising a base member, a discharge sleeve and an upper cover. The base member includes a lower wall, an open upper portion, and at least one through hole disposed in the lower wall of the base member. The discharge sleeve is configured to be inserted into the at least one through hole. The upper cover comprises a plurality of upper cover fragments each including one or more gas inlets and each upper cover fragment is independently replaceable of other upper cover fragments. The discharge sleeve includes an inserting portion, a wing portion, and a gas outlet formed through the inserting portion and wing portion for a gas flow passage. The gas discharging unit can further include a coating layer disposed on surfaces of the plurality of upper cover fragments. Further, an insulating material can be disposed between adjacent upper cover fragments of the plurality.

BRIEF DESCRIPTION OF THE DRAWINGS

These and/or other aspects of an inventive concept will be apparent and more readily appreciated from the following description of the examples, taken in conjunction with the accompanying drawings. In the drawings, like reference characters may refer to the same or similar parts throughout the different views.

DETAILED DESCRIPTION

Figure 1:
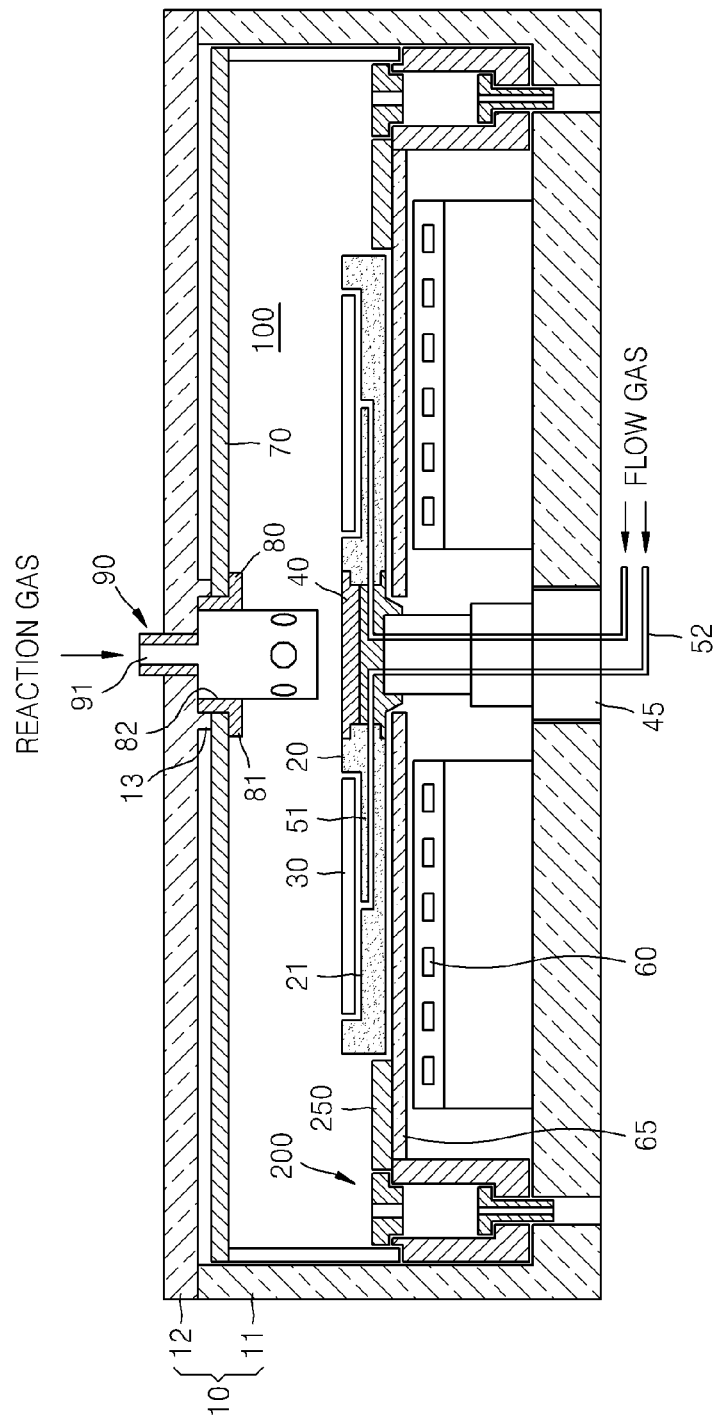
FIG. 1 is a schematic cross-sectional view illustrating a thin film deposition apparatus according to an embodiment of the inventive concept.

Reference will now be made in detail to exemplary embodiments, examples of which are illustrated in the accompanying drawings, wherein like reference numerals refer to the like elements throughout. In this regard, the exemplary embodiments may have different forms and should not be construed as being limited to the descriptions set forth herein. Accordingly, the exemplary embodiments are merely described below, by referring to the figures, to explain aspects of the present description. Expressions such as "at least one of," when preceding a list of elements, modify the entire list of elements and do not modify the individual elements of the list.

Figure 2:
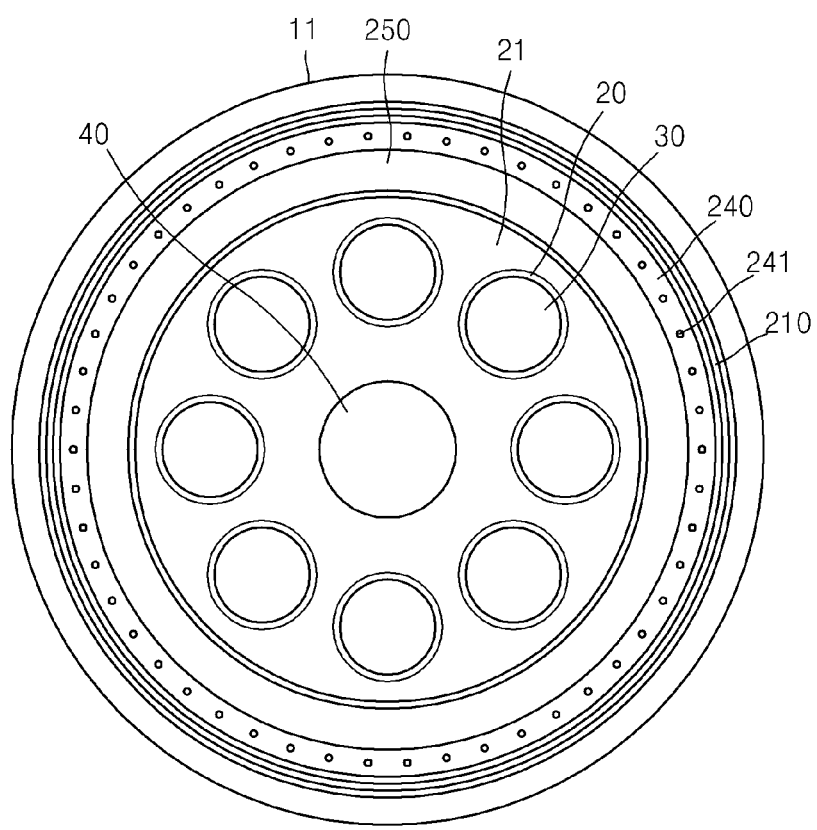
FIG. 2 is a top plan view illustrating the thin film deposition apparatus of FIG. 1 from which a cover portion is removed.

FIG. 1 is a schematic cross-sectional view illustrating a thin film deposition apparatus according to an exemplary embodiment of the present inventive concept. FIG. 2 is a plan view illustrating the thin film deposition apparatus of FIG. 1 from which a cover portion 12 is removed. Referring to FIGS. 1 and 2, the thin film deposition apparatus may include a reaction chamber 100 and a housing 10 surrounding the reaction chamber 100. The housing 10 may be a concave container and may include a lower housing 11 with an upper portion that is open and the cover portion 12 that covers the open upper portion of the lower housing 11. The housing 10 may have an overall cylindrical shape.

An upper sealing member 70 is disposed on an inner portion of the cover portion 12. The upper sealing member 70 is fixed to the cover portion 12. For example, the upper sealing member 70 is fixed to the cover portion 12 using a coupling unit 80. A protrusion 13 protrudes from a lower surface of the cover portion 12, and the coupling unit 80 is coupled to the protrusion 13. For example, a female screw may be used on an inner portion of the protrusion 13, and a male screw may be used on an outer circumference of the coupling unit 80 corresponding to the protrusion 13. A supporting wing 81 that supports the sealing member 70 from below is disposed on the coupling unit 80 to face the protrusion 13. Accordingly, the upper sealing member 70 is coupled to the cover portion 12 in this configuration. The upper sealing member 70 may be, for example, a plate made of quartz, but is not limited thereto. The upper sealing member 70 forms an upper wall of the reaction chamber 100.

Further included is a gas injection portion 90 for supplying a reaction gas into the reaction chamber 100. The gas injecting portion 90 may be arranged in a center portion of the reaction chamber 100. For example, a hollow portion 82 is formed in the coupling unit 80, and the gas injecting portion 90 is coupled to the hollow portion 82. The gas injecting unit 90 includes a connection hole 91 that passes through the cover portion 12 and is connected to the outside so that the reaction gas can be supplied from a reaction gas supplying unit (not shown) into the reaction chamber 100 via the connection hole 91.

A main disk 20 is disposed in the reaction chamber 100. The main disk 20 is rotatably supported by the lower housing 11 via a supporting portion 40. A driving motor 45 supports and rotates the supporting portion 40. Accordingly, the main disk 20 rotates in the reaction chamber 100.

A plurality of pockets 21 are formed in the main disk 20, and a satellite disk 30 is disposed in each of the pockets 21. A deposition target such as a semiconductor wafer is to be mounted on the satellite disk 30.

Figure 3:
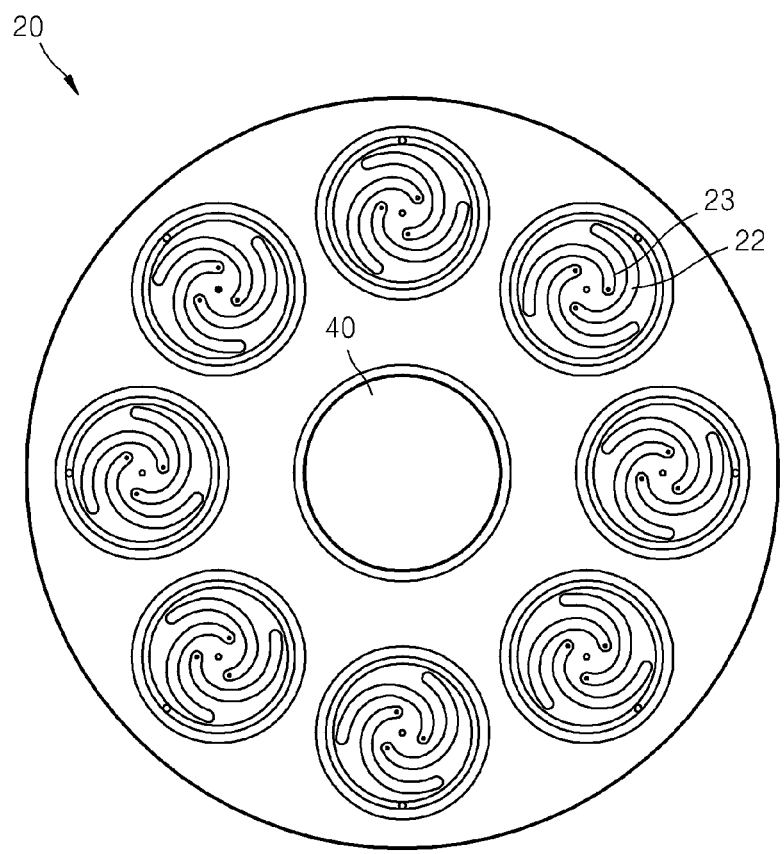
FIG. 3 is a top plan view illustrating a main disk of FIG. 1 according to an exemplary embodiment of the inventive concept.

FIG. 3 is a top plan view illustrating the main disk 20 of FIG. 1 according to the exemplary embodiment of the present inventive concept. Referring to FIG. 3, a plurality of spiral flow grooves 22 are formed in a lower surface of the pockets 21, and a flow gas outlet 23 is formed in each of the flow grooves 22. A first gas flow passage 51 is formed in the supporting portion 40, and a second gas flow passage 52 connected to the first gas flow passage 51 is formed on the main disk 20. According to the above exemplary configuration, a flow gas is supplied from a flow gas supplying unit (not illustrated) into the main disk 20 via the first and second gas flow passages 51 and 52, as shown in FIG. 1, and is ejected from the flow gas outlet 23 as shown in FIG. 3. The ejected flow gas flows from the pockets 21 to the outside along the spiral flow grooves 22, and as a result, the satellite disk 30 disposed in the pocket 21 rotates while slightly floating in the pocket 21. As the satellite disk 30 floats above a lower surface of the pocket 21 while rotating, friction between the lower surface of the pocket 21 and the satellite disk 30 may decrease to become negligibly small due to a cushioning action of the flow gas. By controlling the speed and flow rate of the flow gas, thus a rotation speed of the satellite disk 30 can be controlled.

A heater 60 is disposed below the main disk 20. The heater 60 heats the main disk 20 to a predetermined temperature. For example, the heater 60 may heat the main disk 20 to a temperature of about several hundreds of ° C. to more than about 1,000° C. When growing a GaN-based growth layer, for example, the main disk 20 is heated to a temperature of about 700° C. to about 1300° C. The heater 60 may be a coil to which a high frequency current is applied, in which case the main disk 20 is heated via an inductive heating method. Alternatively, the heater 60 may be a conducting wire from which heat is generated due to resistance heating.

The main disk 20 and the satellite disk 30 are configured to transfer heat of the heater 60 to a deposition target mounted (or disposed) on the satellite disk 30. Accordingly, the main disk 20 and the satellite disk 30 are made of a material that is resistant to a heating temperature generated by the heater 60. For example, the main disk 20 and the satellite disk 30 can be made of graphite. To enhance the durability of the thin film deposition apparatus, a hardness-enhancing coating film such as a silicon carbide (SiC) coating film can be disposed on the main disk 20 and the satellite disk 30.

In the exemplary configuration, the satellite disk 30 on which the deposition target is mounted rotates in the pocket 21 by means of a flow gas. A reaction gas containing a source gas and a carrier gas that is to be deposited on the deposition target through the reaction gas injecting unit 90 is supplied into the reaction chamber 100. The deposition target is maintained at a high temperature by the main disk 20 and the satellite disk 30 which are heated by the heater 60. When the reaction gas contacts an upper surface of the deposition target, a chemical deposition reaction occurs, and a predetermined material such as a GaN-based compound is deposited and grown on the deposition target.

Figure 4A:
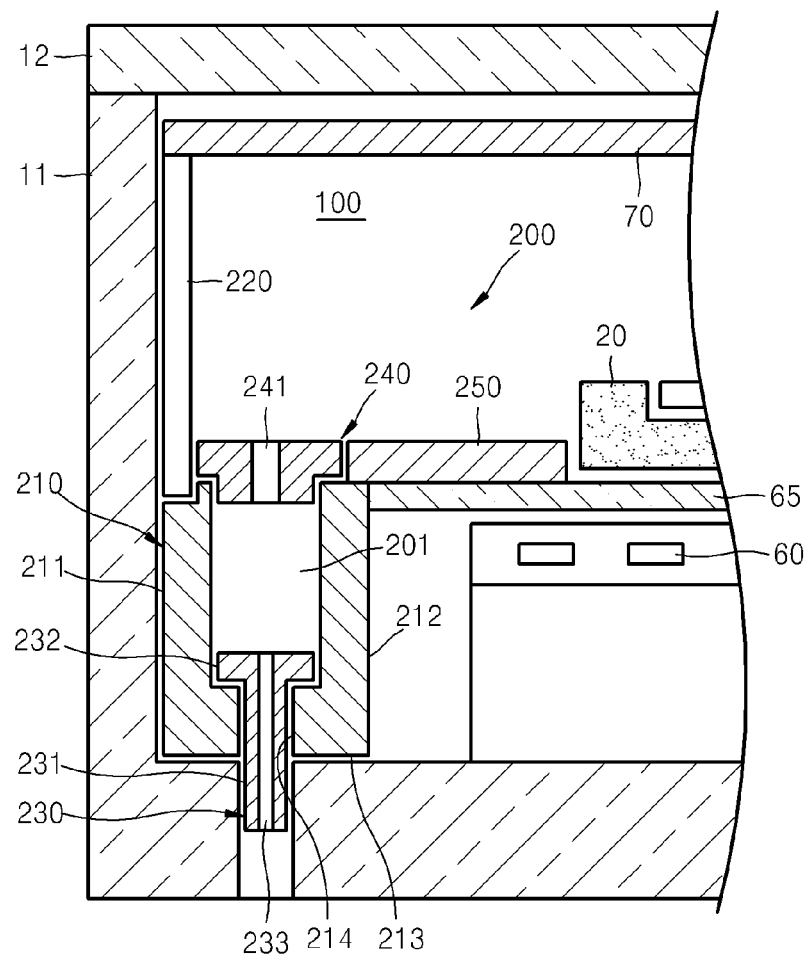
FIG. 4A is a detailed cross-sectional view illustrating an exemplary gas discharging unit of FIG. 1.
Figure 4B:
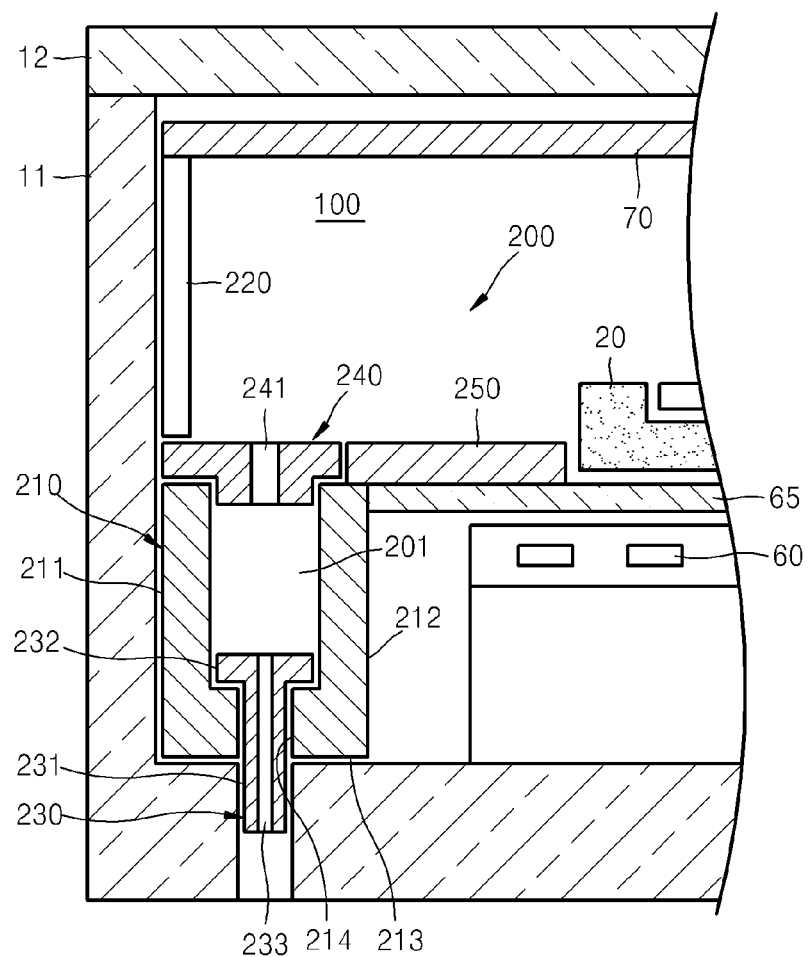
FIG. 4B is a cross-sectional view illustrating a modified example of the exemplary gas discharging unit illustrated in FIG. 4A.
Figure 5:
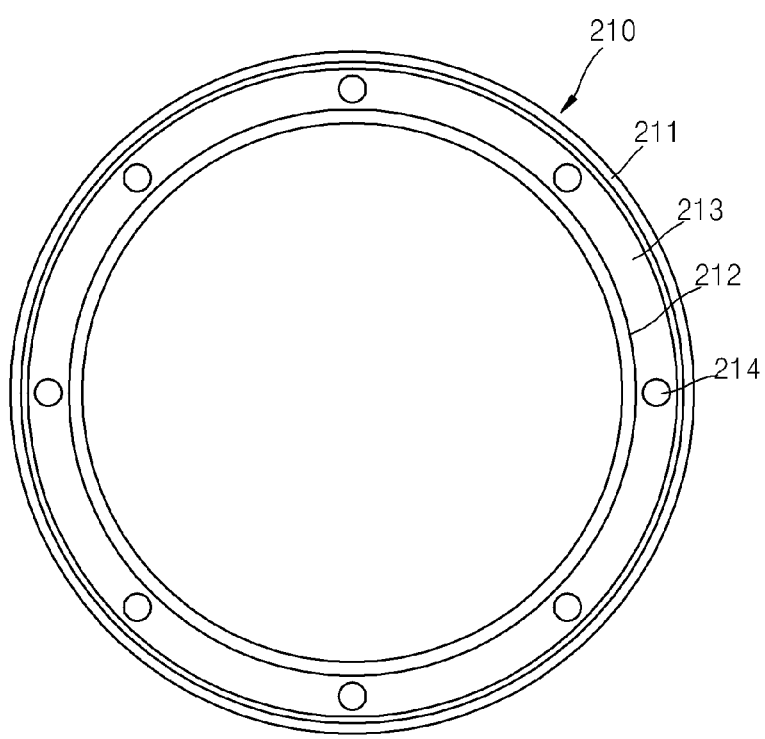
FIG. 5 is a top plan view illustrating a base member illustrated in FIG. 4A.

FIGS. 4A and 4B are detailed cross-sectional views illustrating the exemplary gas discharging unit of FIG. 1. FIG. 5 is a top plan view illustrating a base member illustrated in FIG. 4A. Only a portion of the reaction gas supplied into the reaction chamber 100 is used to form a deposition layer on a deposition target, and the rest is discharged from the reaction chamber 100. Also, the flow gas needs to be discharged from the reaction chamber 100 after being used to rotate the satellite disk 30. To this end, a gas discharging unit 200 is disposed in the reaction chamber 100.

Referring to FIGS. 1, 4A, and 5, the gas discharging unit 200 includes a base member 210 that is disposed on an edge of the reaction chamber 100. The base member 210 includes an outer sidewall 211, an inner sidewall 212, and a lower wall 213 connecting the outer sidewall 211 and inner sidewall 212. The base member 210 is a ring-shaped member with a cross-sectional area of which is an approximately "U" shape having an open upper portion. A ring-shaped sidewall member 220 that extends upwardly and forms a sidewall of the reaction chamber 100 is supported on the outer sidewall 211 of the base member 210. The sidewall member 220 forms a sidewall of the reaction member 100. An upper sealing member 70 is mounted on the sidewall member 220. The sidewall member 220 may be integral with the outer sidewall 211 (i.e., having the outer sidewall 211 of the base member 210 extending upward). The base member 210 is supported by the lower housing 11.

A through hole 214 is formed in the lower wall 213. A discharge sleeve 230 for discharging a gas is inserted into the through hole 214. In the exemplary embodiment, the discharge sleeve 230 is inserted into the through hole 214 via the open upper portion of the base member 210. The discharge sleeve 230 comprises an inserting portion 231 that is to be inserted into the through hole 214 and a wing portion 232 that extends from the inserting portion 231 to the outside so as to be engaged with the lower wall 213. A gas outlet 233 is formed to pass through the wing portion 232 and the inserting portion 231 such that the gas is discharged from a collection space 201 to the outside. A plurality of through holes 214 is formed, and the discharge sleeve 230 is inserted into each of the plurality of through holes 214. While eight through holes 214 are illustrated in FIG. 5, the number of the through holes 214 is not limited thereto.

Referring to FIGS. 2 and 4A, the upper cover 240 covers the open upper portion of the base member 210. The upper cover 240 is a ring-shaped member in which a plurality of gas inlets 241 passing through in a vertical direction are formed. The number of gas inlets 241 may be the same as or greater than the number of the through holes 214 formed in the base member 210. When the upper cover 240 is coupled to the base member 210, a collection space 201 into which gas is collected is formed together with the outer sidewall 211, the inner sidewall 212, and the lower wall 213. The base member 210 and the upper cover 240 may be made of, for example, graphite.

FIG. 4B is a cross-sectional view illustrating a modified example of the exemplary gas discharging unit illustrated in FIG. 4A. Referring to FIG. 4B, the upper cover 240 extends outward to portions above the base member 210, and the sidewall member 220 is disposed above the upper cover 240. Accordingly, the upper cover 240 and the sidewall member 220 can be removed at once by lifting up both of them. The sidewall member 220 may be coupled to the upper cover 240.

In the exemplary configuration, when a pressure in the reaction chamber 100 increases due to the flow gas used to rotate the satellite disk 30 and the reaction gas left after being used in forming a deposition layer on a surface of a deposition target, the flow gas and reaction gas are absorbed into the collection space 201 via the gas inlet 241 disposed in the upper cover 240. Then, the flow gas and reaction gas are discharged to the outside via the gas outlet 233 of the discharge sleeve 230.

Figure 6:
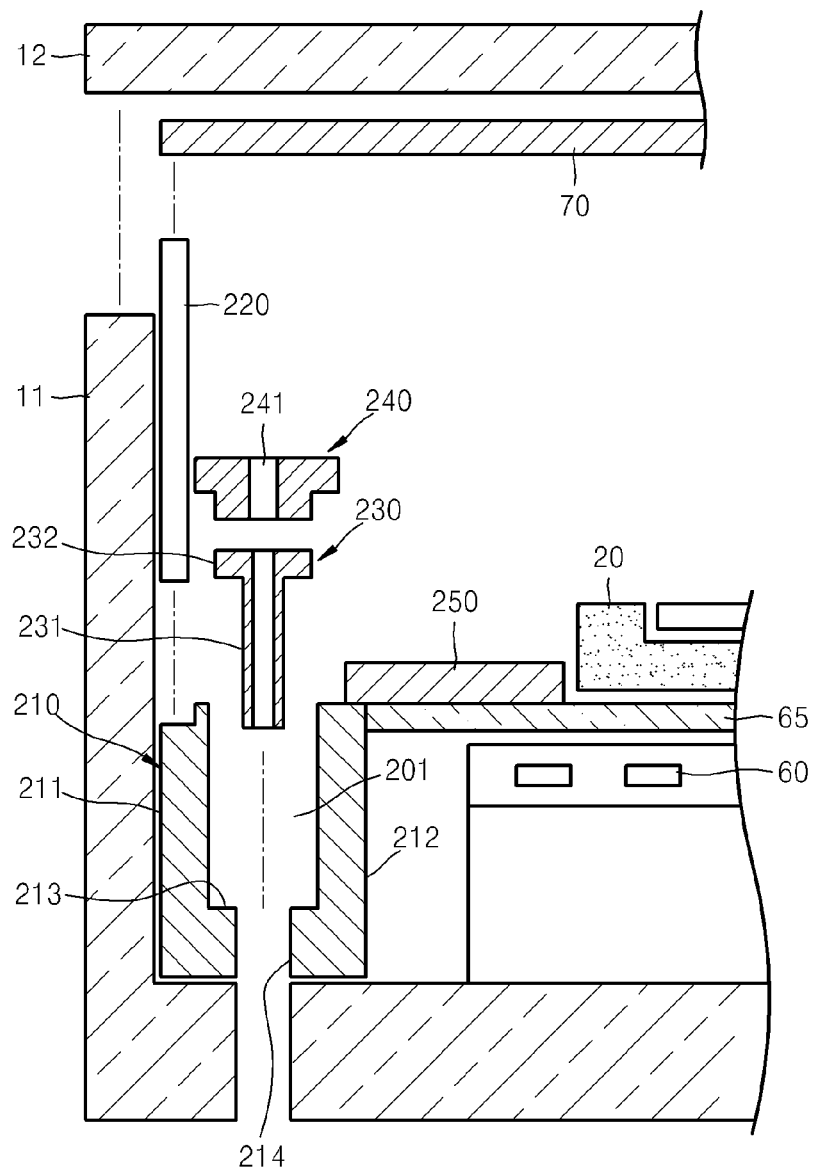
FIG. 6 is a cross-sectional view illustrating a cover portion, a sidewall member, and an upper cover that are separated from one another in order to replace a sleeve.

FIG. 6 is a cross-sectional view illustrating a cover portion, a sidewall member, and an upper cover separated from one another in order to replace a sleeve.

If the thin film deposition apparatus is used for a long period of time, a deposition material via the reaction gas may be attached on the gas inlet 241 and the gas outlet 233, and thus may hinder smooth gas discharging. In addition, the gas inlet 241 and the gas outlet 233 may be clogged by the deposition material. For smooth gas discharge, maintenance of the gas inlet 241 and the gas outlet 233 is to be conducted. In this case, the thin film deposition apparatus needs to be disassembled. Referring to FIG. 6, in the exemplary thin film deposition apparatus, as the upper sealing member 70 is coupled to the cover portion 12, when the cover portion 12 is separated, the upper cover 240 of the gas discharging unit 200 is exposed. Further, if needed, even the sidewall member 220 may be separated. In this state, a deposition material deposited on an inner wall of the gas inlet 241 and an upper surface of the upper cover 240 can be removed using a sharp pin or the like. Further, the upper cover 240 can be replaced. If the gas outlet 233 has to be cleaned, when the upper cover 240 is separated, the collection space 201 of the base member 210 and the discharge sleeve 230 are exposed. The discharge outlet 233 may be cleaned while the discharge sleeve 230 is inserted into the through hole 214 or while the discharge sleeve 230 is pulled upward to be separated from the through hole 214. In addition, the discharge sleeve 230 may be replaced with a new one.

As described above, in the thin film deposition apparatus according to the exemplary embodiment of the present inventive concept, the discharge sleeve 230 is installed in the lower wall 213 of the base member 210 in such a manner that the discharge sleeve 230 can be separated therefrom in a vertical direction, and thus, the gas outlet 233 may be cleaned or the discharge sleeve 230 may be replaced without disassembling the base member 210 from the lower housing 11. Accordingly, maintenance of the thin film deposition apparatus is easy, and maintenance time may be reduced, thereby improving productivity of the thin film deposition apparatus.

Figure 7:
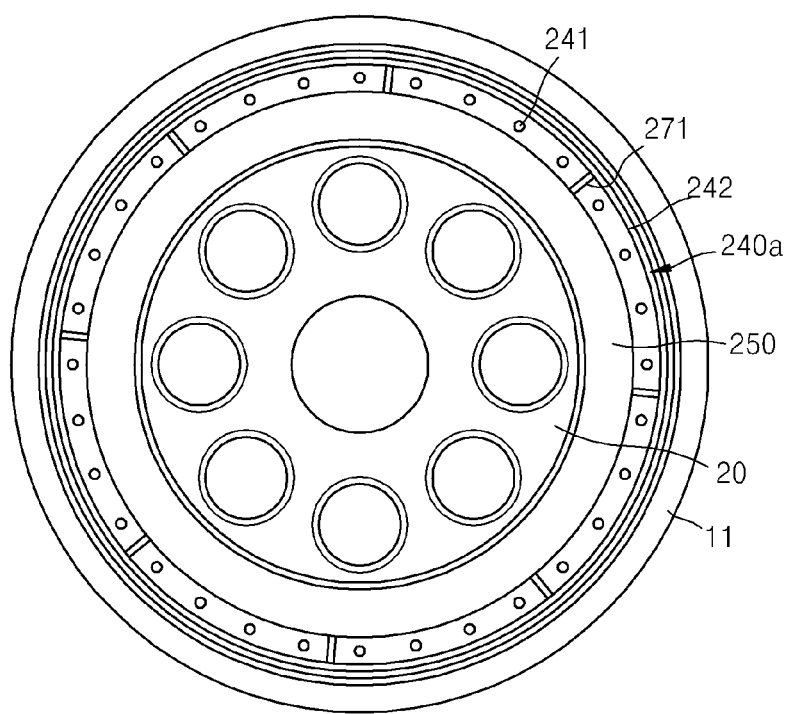
FIG. 7 is a top plan view illustrating an upper cover formed of a plurality of fragments, according to an exemplary embodiment of the present inventive concept.

FIG. 7 is a top plan view illustrating an upper cover 240a comprising a plurality of fragments, according to an exemplary embodiment of the present inventive concept.

Referring to FIG. 7, an upper cover 240a includes a plurality of upper cover fragments 242 disposed in a circumferential direction. As the upper cover fragments 242 are coupled to cover an upper portion of the base cover 210, the ring-shaped upper cover 240a is formed. At least one gas inlet 241 is disposed in each of the upper cover fragments 242. When one of the gas inlets 241 is clogged, just the upper cover fragment 242 including the corresponding clogged gas inlet 241 can be replaced, thereby reducing maintenance costs. While eight upper cover fragments 242 are illustrated in FIG. 7, the embodiments of the present inventive concept are not limited thereto. Moreover, sizes of the upper cover fragments 242 do not have to be the same; they may vary. The number and size of the upper cover fragments 242 may be selected in consideration of the size of the thin film deposition apparatus and convenience of maintenance, etc.

When the heater 60 heats the main disk 20 using an inductive heating method, due to an influence of an electromagnetic field generated in the heater 60, an electrical discharge may occur among the upper cover fragments 242, and the upper cover fragments 242 may be damaged by the electrical discharge. To prevent this, a discharge prevention coating layer may be formed on surfaces of the upper cover fragments 242. The discharge prevention coating layer may be, for example, a silicon carbide (SiC) layer. Alternatively, an insulating material 271 may be disposed between the upper cover fragments 242 to prevent the electrical discharge.

If the reaction gas reaches an area below the main disk 20, a deposition material formed via the reaction gas may be deposited on the heater 60 or the like, which may cause a failure of the thin film deposition apparatus. Referring to FIG. 1, a diffusion barrier 65 is thus disposed below the main disk 20. The diffusion barrier 65 prevents intrusion of the reaction gas or the flow gas below the main disk 20. The diffusion barrier 65 is separated from a lower surface of the main disk 20 by a predetermined distance. The diffusion barrier 65 may be made of, for example, quartz.

Referring to FIG. 1, an upper surface of the diffusion barrier 65 made of quartz is exposed to the reaction gas, and thus, a deposition material may be deposited on the upper surface of the diffusion barrier 65 by a chemical reaction with the reaction gas. The deposition material may be deposited on the upper surface of the diffusion barrier 65 irregularly, thereby increasing a thickness of irregularity of the diffusion barrier 65. The diffusion barrier 65 thermally expands when heated by the heater 60, and if the thickness thereof is not regular, due to the deposition material attached on the upper surface of the diffusion barrier 65, a thermal expansion amount is not uniform over the entire area of the diffusion barrier 65. Moreover, due to a difference between a coefficient of thermal expansion of the deposition material and a coefficient of thermal expansion of the diffusion barrier 65, the irregularity of thermal expansion is further increased. Consequently, warpage (due to the irregularity of thermal expansion) of the diffusion barrier 65 may result. The warpage may cause the diffusion barrier 65 to contact the lower surface of the main disk 20 so that the diffusion barrier 65 brakes. Thus, the diffusion barrier 65 may need be replaced regularly, but it is difficult to replace the diffusion barrier 65 because, since the diffusion barrier 65 is disposed below the main disk 20, even the main disk 20 has to be disassembled in order to replace the diffusion barrier 65.

In order to address the above problem, a contact between the diffusion barrier 65 and the reaction gas may be blocked as much as possible so that the deposition material is not deposited on a surface of the diffusion barrier 65. Referring to FIGS. 1, 2, and 4A, a diffusion barrier cover 250 is disposed on the diffusion barrier 65. The diffusion barrier cover 250 is a ring-shaped member including an inner circumferential portion that is adjacent to an outer circumferential portion of the main disk 20. The diffusion barrier cover 250 also includes an outer circumferential portion that is adjacent to the upper cover 240. The inner circumferential portion of the diffusion barrier cover 250 is spaced apart at a predetermined distance from the outer circumferential portion of the main disk 20. The outer circumferential portion of the diffusion barrier cover 250 is supported on the upper cover 240 or may be spaced apart at a predetermined distance from the upper cover 240 or may be supported on the base cover 210.

As described above, by reducing the possibility that the reaction gas contacts the diffusion barrier 65 by using the diffusion barrier cover 250, deformation (i.e., warpage) of the diffusion barrier 65 may be prevented. Here, the reaction gas may contact the diffusion barrier cover 250 so that the deposition material may be attached on an upper surface of the diffusion barrier cover 250. The diffusion barrier cover 250 may be exposed to the outside by separating the cover portion 12, and may be easily replaced without separating the main disk 20. Thus, time and costs for maintenance of the thin film deposition apparatus may be reduced.

The diffusion barrier cover 250 may be made of quartz, but the diffusion barrier cover 250 made of quartz may brake due to repetitive thermal stress. When broken fragments of quartz are jammed between the main disk 20 and the diffusion barrier 65, the main disk 20 may be damaged. Moreover, rotation of the main disk 20 may be hindered due to the broken fragments of quartz. In the exemplary embodiment, the diffusion barrier cover 250 is made of graphite. Graphite has greater strength than quartz and is highly resistant to thermal stress. Thus, when graphite is used, damage to the diffusion barrier cover 250 may be prevented. In addition, to enhance hardness of the diffusion barrier cover 250, a silicon carbide (SiC) coating layer may be disposed on a surface of the diffusion barrier cover 250 of graphite, thereby further reducing the possibility of damage to the diffusion barrier cover 250. Consequently, costs for maintenance of the thin film deposition apparatus may be reduced. In addition, operation reliability of the thin film deposition apparatus may be increased.

Figure 8:
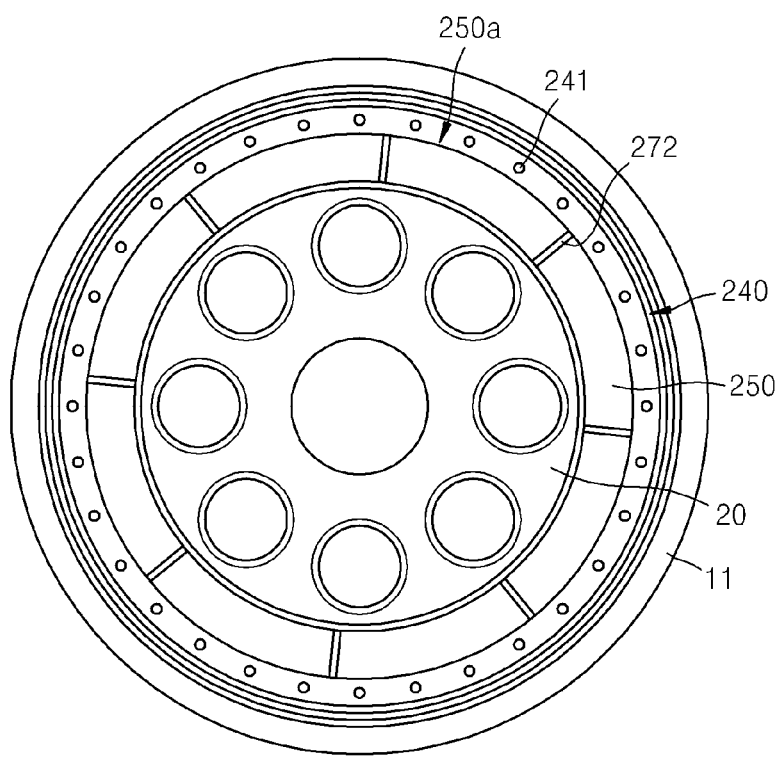
FIG. 8 is a top plan view illustrating a diffusion barrier cover formed of a plurality of fragments, according to an exemplary embodiment of the present inventive concept.

FIG. 8 is a top plan view illustrating a diffusion barrier cover 250a including a plurality of fragments, according to an exemplary embodiment of the present inventive concept. Referring to FIG. 8, the diffusion barrier cover 250a includes a plurality of diffusion barrier cover fragments 251 that are disposed in a circumferential direction. As the diffusion barrier cover fragments 251 are arranged above the diffusion barrier 65, the ring-shaped diffusion barrier cover 250a is formed. During use of the thin film deposition apparatus, when a deposition material is excessively attached regularly or irregularly or where cracks are formed, the diffusion barrier cover fragments 251 can be selectively replaced, and thus, the costs for maintenance may be reduced. While eight of the diffusion barrier cover fragments 251 are illustrated in FIG. 8, the embodiments of the present inventive concept are not limited thereto. In addition, the sizes of the diffusion barrier cover fragments 251 may vary. The number and size of the diffusion barrier cover fragments 251 may be selected in consideration of the size of the thin film deposition apparatus and convenience of maintenance or the like factors.

When the heater 60 heats the main disk 20 via an inductive heating method, due to an influence of an electromagnetic field generated in the heater 60, an electrical discharge may occur among the diffusion barrier cover fragments 251, and the diffusion barrier cover fragments 251 may be damaged by the discharge. To prevent this, a discharge prevention coating layer is disposed on surfaces of the diffusion barrier cover fragments 251. The discharge prevention coating layer may be, for example, a silicon carbide (SiC) layer. Alternatively, an insulating material 272 may be disposed between the diffusion barrier cover fragments 251 to prevent the electrical discharge.

The diffusion barrier cover 250 illustrated in FIG. 7 may be replaced with the diffusion barrier cover 250a illustrated in FIG. 8. In this case, the number of the diffusion barrier cover fragments 251 and the number of the upper cover fragments 242 do not have to be the same.

Figure 9A:
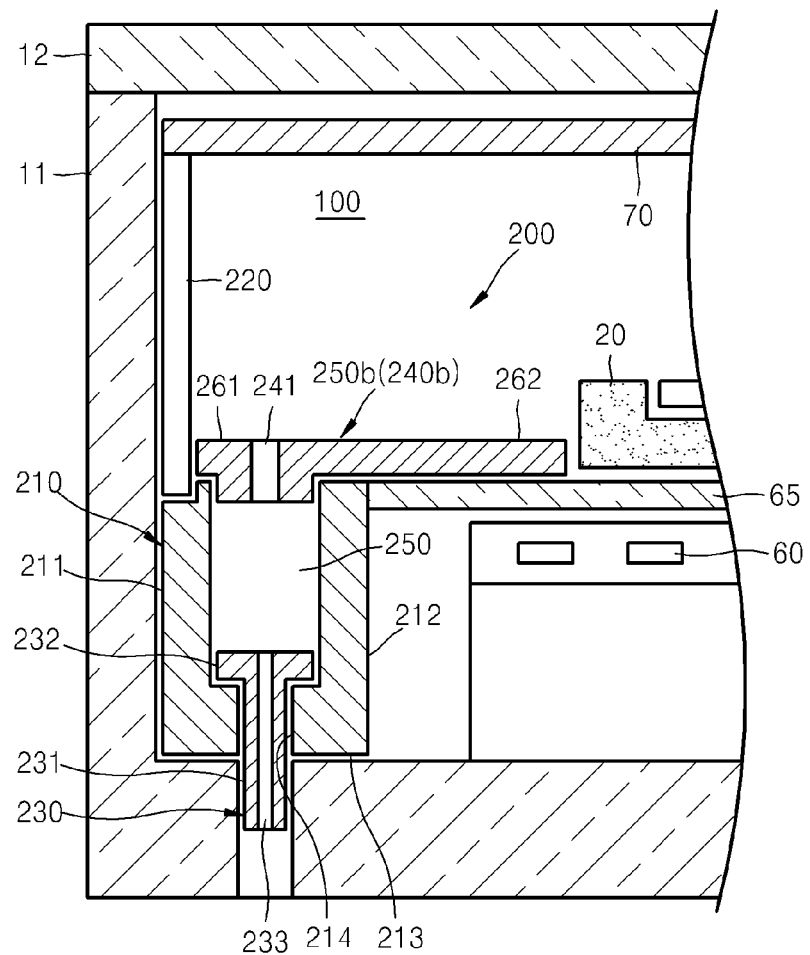
FIG. 9A is a cross-sectional view illustrating an upper cover and a diffusion barrier cover that are integrally coupled to each other.
Figure 10:
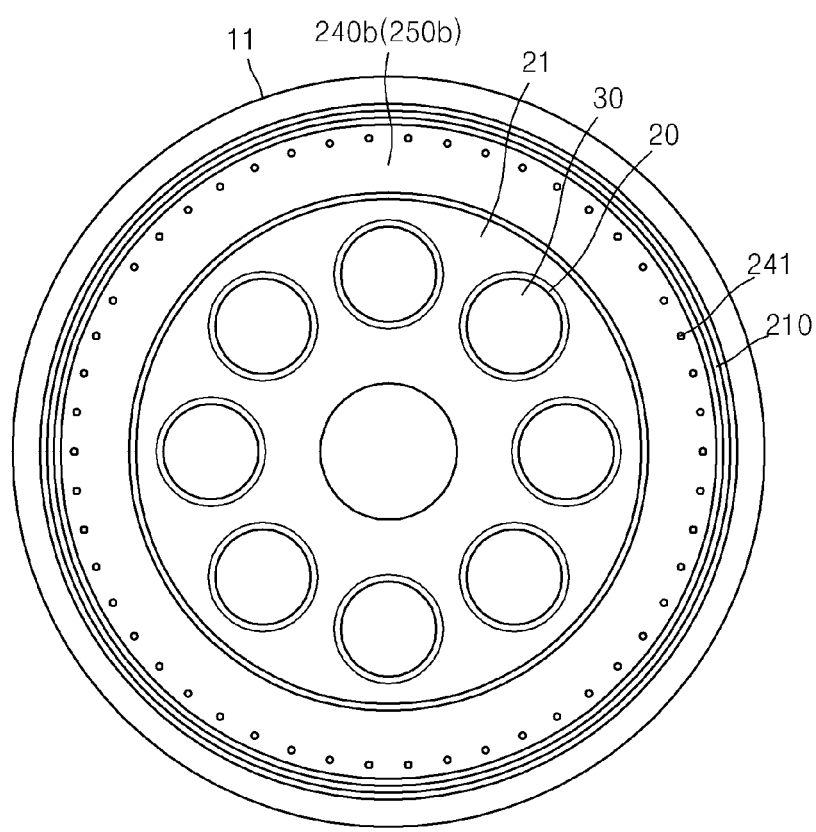
FIG. 10 is a top plan view of the exemplary gas discharging unit of FIG. 9A.

FIG. 9A is a cross-sectional view illustrating an upper cover and a diffusion barrier cover that are integrally coupled to each other. FIG. 10 is a top plan view of the gas discharging unit of FIG. 9A. The diffusion barrier cover 250 and the upper cover 240 may be integrally formed. Referring to FIGS. 9A and 10, in the exemplary embodiment an upper cover 240b (or a diffusion barrier cover 250b) including the diffusion barrier cover 250 and the upper cover 240 are formed integrally (FIG. 4A). The upper cover 240b (or the diffusion barrier cover 250b) may include a barrier portion 262 covering the diffusion barrier 65 and a cover portion 261 covering the open upper portion of the base member 210. The gas inlet 241 is disposed in the cover portion 261. According to this exemplary configuration, as the diffusion barrier cover 250 and the upper cover 240 shown in FIG. 4A are integrally formed, the number of components of may be reduced, and when replacement is necessary, a replacement operation may be promptly conducted, and thus, the costs of components and the time for maintenance may be reduced. In addition, the discharge sleeve 230 may be replaced by separating the upper cover 240b (or the diffusion barrier cover 250b), and thus the time and costs for maintenance of the discharge sleeve 230 may be reduced.

Figure 9B:
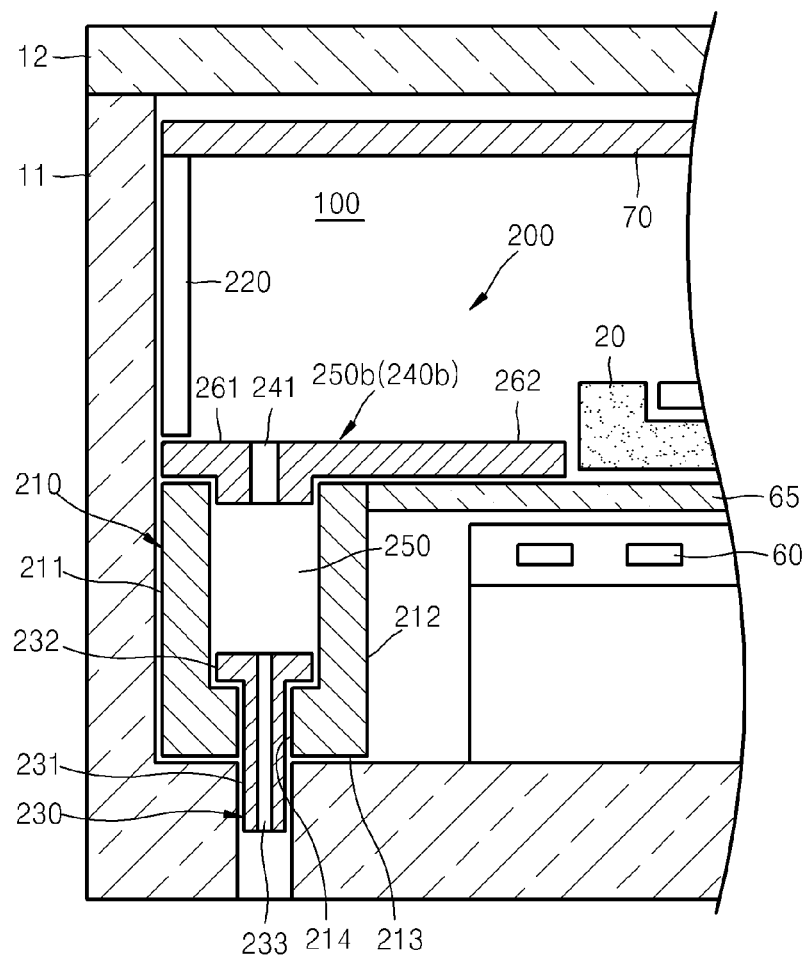
FIG. 9B is a cross-sectional view illustrating a modified example of the exemplary gas discharging unit illustrated in FIG. 9A.

FIG. 9B is a cross-sectional view illustrating a modified example of the gas discharging unit illustrated in FIG. 9A.

Referring to FIG. 9B, the upper cover 240b (or the diffusion barrier cover 250b) may extend outwardly to portions above the base member 210, and a sidewall member 220 is disposed above the upper cover 240. Accordingly, the upper cover 240b (or the diffusion barrier cover 250b and the sidewall member 220 may be lifted at once for removal. The sidewall member 220 may be coupled to the upper cover 240b (or the diffusion barrier cover 250b).

Figure 11:
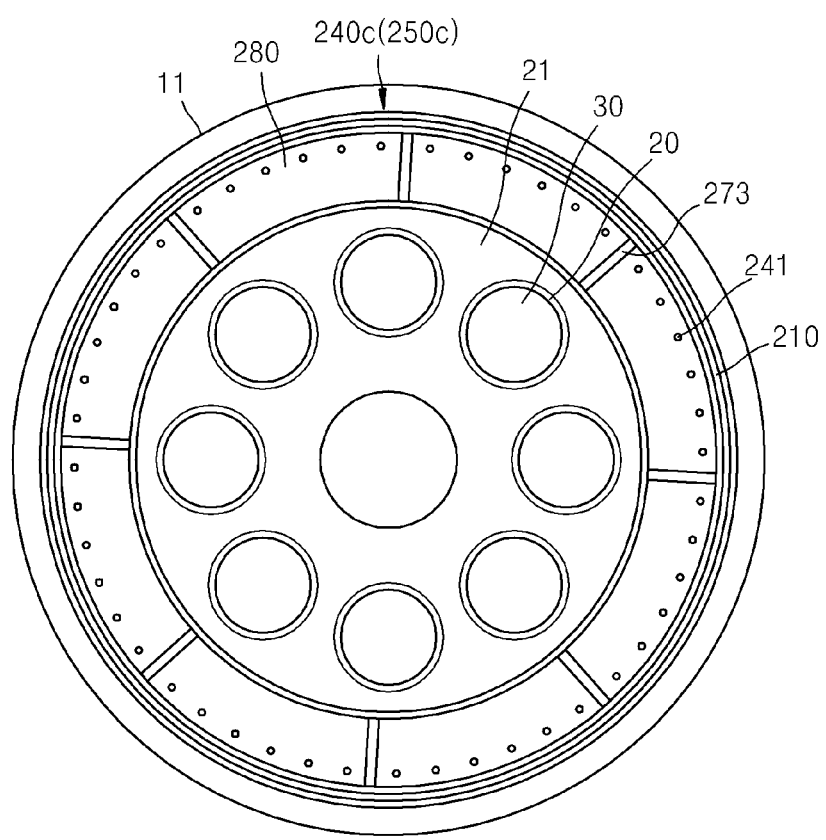
FIG. 11 is a top plan view illustrating an upper cover and a diffusion barrier cover that are integrally formed and are formed of a plurality of fragments arranged in a circumferential direction.

The upper cover 240a (FIG. 7) and the diffusion barrier cover 250a (FIG. 8) may also be integrally formed. FIG. 11 is a top plan view illustrating an upper cover and a diffusion barrier cover that are integrally formed and are formed of a plurality of fragments arranged in a circumferential direction. Referring to FIG. 11, an upper cover 240c (or 250c) formed by integrally forming the upper cover 240a and the diffusion barrier cover 250a is illustrated. The upper cover 240c (or 250c) includes a plurality of fragments 280 that are disposed in a circumferential direction. The cross-sectional view of the fragments 280 is as illustrated in FIG. 9A. The fragments 280 may each include a barrier portion 262 covering the diffusion barrier 65 and a cover portion 261 covering the open upper portion of the base member 210. A gas inlet 241 is disposed in the cover portion 261. As the plurality of fragments 280 is disposed above the base member 210 and the diffusion barrier 65, the ring-shaped upper cover 240c (or the diffusion barrier cover 250c) is disposed.

When the heater 60 heats the main disk 20 via an inductive heating method, due to an influence of an electromagnetic field generated in the heater 60, an electrical discharge may occur among the fragments 280 and the fragments 280 may be damaged by the electrical discharge. To prevent this, a discharge prevention coating layer is disposed on surfaces of the fragments 280. The discharge prevention coating layer may be, for example, a silicon carbide (SiC) layer. Alternatively, an insulating material 271 may be disposed between the upper cover fragments 242 to prevent the electrical discharge.

According to this exemplary configuration, only the fragments 280 with the clogged gas inlet 241 (or the fragments 280 with a deposition material excessively attached) need to be replaced, thereby reducing the maintenance costs.

Although exemplary embodiments of the present inventive concept have been shown and described, it will be appreciated by those skilled in the art that changes may be made without departing from the principles and spirit of the inventive concept, the scope of which is defined in the appended claims.

What is claimed is:

1. A thin film deposition apparatus comprising:
    a reaction chamber;
    a main disk installed in the reaction chamber; and
    a gas discharging unit that is disposed outside the main disk and is configured to recollect a gas in the reaction chamber,
    wherein the gas discharging unit comprises:
        a base member that includes an outer sidewall, an inner sidewall, and a lower wall that connects the outer and inner sidewalls, wherein the base member comprises a ring-shaped member including an open upper portion, and at least one through hole is disposed in the lower wall;
        a discharge sleeve that is inserted into the at least one through hole, wherein a gas outlet is formed in the discharge sleeve; and
        an upper cover comprising a ring-shaped member covering the open upper portion of the base member, wherein a plurality of gas inlets are formed in the upper cover.

2. The thin film deposition apparatus of claim 1, wherein the discharge sleeve of the gas discharging unit comprises an inserting portion configured to be inserted into the at least one through hole, and a wing portion extending from the inserting portion.

3. The thin film deposition apparatus of claim 1, wherein the upper cover of the gas discharging unit comprises a plurality of upper cover fragments that are disposed in a circumferential direction.

4. The thin film deposition apparatus of claim 3, wherein an insulating material is interposed between the plurality of upper cover fragments.

5. The thin film deposition apparatus of claim 3, wherein the plurality of upper cover fragments comprises graphite, and a coating layer of a silicon carbide is disposed on surfaces of the plurality of upper cover fragments.

6. The thin film deposition apparatus of claim 1, further comprising:
   a diffusion barrier disposed below the main disk and configured to prevent diffusion of a gas to an area below the main disk; and
   a diffusion barrier cover disposed outside the main disk and configured to cover an upper surface of the diffusion barrier, wherein the diffusion barrier cover comprises graphite.

7. The thin film deposition apparatus of claim 6, wherein the diffusion barrier cover comprises a plurality of diffusion barrier cover fragments that are disposed in a circumferential direction, and an insulating material is interposed between the diffusion barrier cover fragments.

8. The thin film deposition apparatus of claim 7, wherein a silicon carbide coating layer is disposed on surfaces of the plurality of diffusion barrier cover fragments.

9. The thin film deposition apparatus of claim 6, wherein the diffusion barrier cover is integral with the upper cover, and the diffusion barrier cover comprises a cover portion covering the open upper portion of the base member and comprising a gas inlet and a barrier portion that covers an upper surface of the diffusion barrier.

10. The thin film deposition apparatus of claim 1, further comprising:
   a housing comprising a lower housing in the form of a concave container with an open upper portion and a cover portion covering the open upper portion, wherein the housing surrounds the reaction chamber;
   a sidewall member that is disposed in the housing to form a sidewall of the reaction chamber, wherein the sidewall member is supported by an outer sidewall of the base member and extends upwardly; and
   an upper sealing member that is coupled to the cover portion and is adhered to the sidewall member to form an upper wall of the reaction chamber.

* * * * *